United States Patent
Someya

(10) Patent No.: US 9,589,972 B2
(45) Date of Patent: Mar. 7, 2017

(54) ULTRAVIOLET-ERASABLE NONVOLATILE SEMICONDUCTOR DEVICE

(71) Applicant: SEIKO INSTRUMENTS INC., Chiba-shi, Chiba (JP)

(72) Inventor: Tetsuo Someya, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/769,048

(22) PCT Filed: Jan. 22, 2014

(86) PCT No.: PCT/JP2014/051182
§ 371 (c)(1),
(2) Date: Aug. 19, 2015

(87) PCT Pub. No.: WO2014/129252
PCT Pub. Date: Aug. 28, 2014

(65) Prior Publication Data
US 2016/0005744 A1    Jan. 7, 2016

(30) Foreign Application Priority Data

Feb. 21, 2013    (JP) .................................. 2013-032114

(51) Int. Cl.
| | | |
|---|---|---|
| *H01L 23/48* | (2006.01) | |
| *H01L 27/115* | (2006.01) | |
| *H01L 23/31* | (2006.01) | |
| *H01L 23/532* | (2006.01) | |
| *H01L 27/144* | (2006.01) | |

(52) U.S. Cl.
CPC ........ *H01L 27/115* (2013.01); *H01L 23/3192* (2013.01); *H01L 23/53295* (2013.01); *H01L 27/1443* (2013.01); *H01L 2924/0002* (2013.01)

(58) Field of Classification Search
CPC ....................... H01L 21/28273; H01L 29/788; H01L 29/792
USPC .......................................... 257/431, 316, 774
See application file for complete search history.

(56) References Cited

U.S. PATENT DOCUMENTS

2003/0082905 A1 *  5/2003  Hung et al. ................... 438/633
2007/0218679 A1 *  9/2007  Schneider ......... H01L 21/31138
                                                                    438/638

FOREIGN PATENT DOCUMENTS

JP          05-299661 A   *  4/1992   ........... H01L 29/788

OTHER PUBLICATIONS

Abstract, Publication No. 2006-344956, Publication Date Dec. 21, 2006.

(Continued)

*Primary Examiner* — Theresa T Doan
(74) *Attorney, Agent, or Firm* — Adams & Wilks

(57) ABSTRACT

An ultraviolet-erasable nonvolatile semiconductor device has a protective film comprised of a silicon nitride film on which is laminated a silicon oxynitride film. The silicon nitride film has a thickness of 1000 Å or more and 2000 Å or less and the silicon oxynitride film has a thickness of about 7000 Å or more. The silicon nitride film and the silicon oxynitride film cooperate to prevent moisture from penetrating into the ultraviolet-erasable nonvolatile semiconductor device. The thickness of the silicon nitride film is set so that the time for erasing data in a nonvolatile semiconductor storage element through irradiation with ultraviolet rays is not increased.

6 Claims, 3 Drawing Sheets

(56) References Cited

OTHER PUBLICATIONS

Abstract, Publication No. KR100832715, Publication Date May 28, 2008.
European Search Report issued Sep. 30, 2016 in Application No. EP 14 75 4296.

* cited by examiner

ULTRAVIOLET-ERASABLE NONVOLATILE SEMICONDUCTOR DEVICE

TECHNICAL FIELD

The present invention relates to an ultraviolet-erasable nonvolatile semiconductor device.

BACKGROUND ART

Erosion by moisture has been a concern in a semiconductor device represented by a semiconductor integrated circuit. In order to cope with this, as disclosed in Patent Literature 1, a nitride film having an excellent water resistance is formed on a surface of the semiconductor device so that moisture is prevented from penetrating into the semiconductor device, to thereby enhance a water resistance of the semiconductor device.

CITATION LIST

Patent Literature

[PTL 1] JP 2006-344956 A

SUMMARY OF INVENTION

Technical Problem

However, when the technology disclosed in Patent Literature 1 is applied to an ultraviolet-erasable nonvolatile semiconductor device capable of erasing data by ultraviolet rays, due to the presence of the nitride film, the water resistance of the semiconductor device is enhanced but the ultraviolet rays are difficult to transmit therethrough, and hence the data cannot be erased by the ultraviolet rays or a large amount of time is required to erase the data. Thus, there is demand for a structure that has a high water resistance and is suitable for an ultraviolet-erasable nonvolatile semiconductor device capable of erasing data by ultraviolet rays.

The present invention has been made in view of the problems described above, and provides an ultraviolet-erasable nonvolatile semiconductor device that has a high water resistance and is capable of erasing data by ultraviolet rays.

Solution to Problem

In order to solve the problems described above, according to one embodiment of the present invention, there is provided an ultraviolet-erasable nonvolatile semiconductor device, including: a semiconductor substrate; a nonvolatile semiconductor storage element formed in the semiconductor substrate; a top metal formed on the semiconductor substrate; and a protective film formed on the top metal. The protective film includes a silicon nitride film and a silicon oxynitride film. The silicon nitride film and the silicon oxynitride film cooperate to prevent moisture from penetrating into the ultraviolet-erasable nonvolatile semiconductor device. The silicon nitride film has such a thickness with which it is possible to shorten a time for erasing data in the nonvolatile semiconductor storage element through irradiation of ultraviolet rays.

Advantageous Effects of Invention

The ultraviolet-erasable nonvolatile semiconductor device according to the one embodiment of the present invention has the high water resistance and is capable of erasing the data by the ultraviolet rays.

DESCRIPTION OF EMBODIMENTS

In the following, embodiments of the present invention are described with reference to the drawings.

Figure 1:
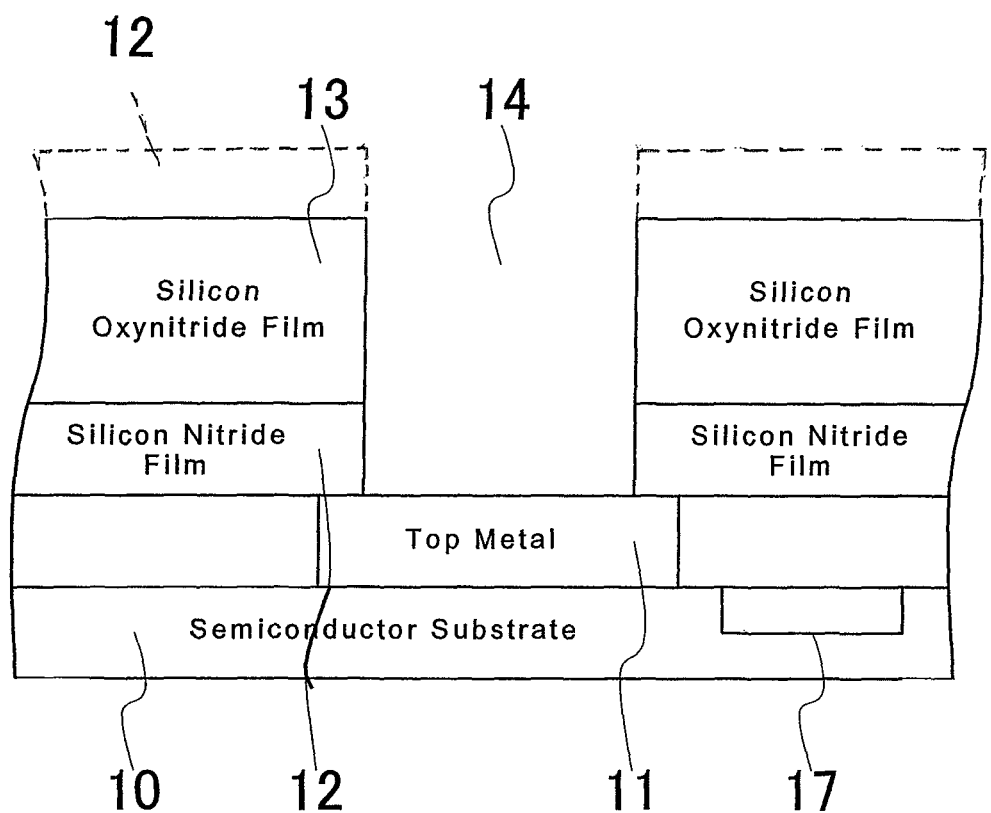
FIG. 1 is a sectional view of an ultraviolet-erasable nonvolatile semiconductor device.
Figure 3:
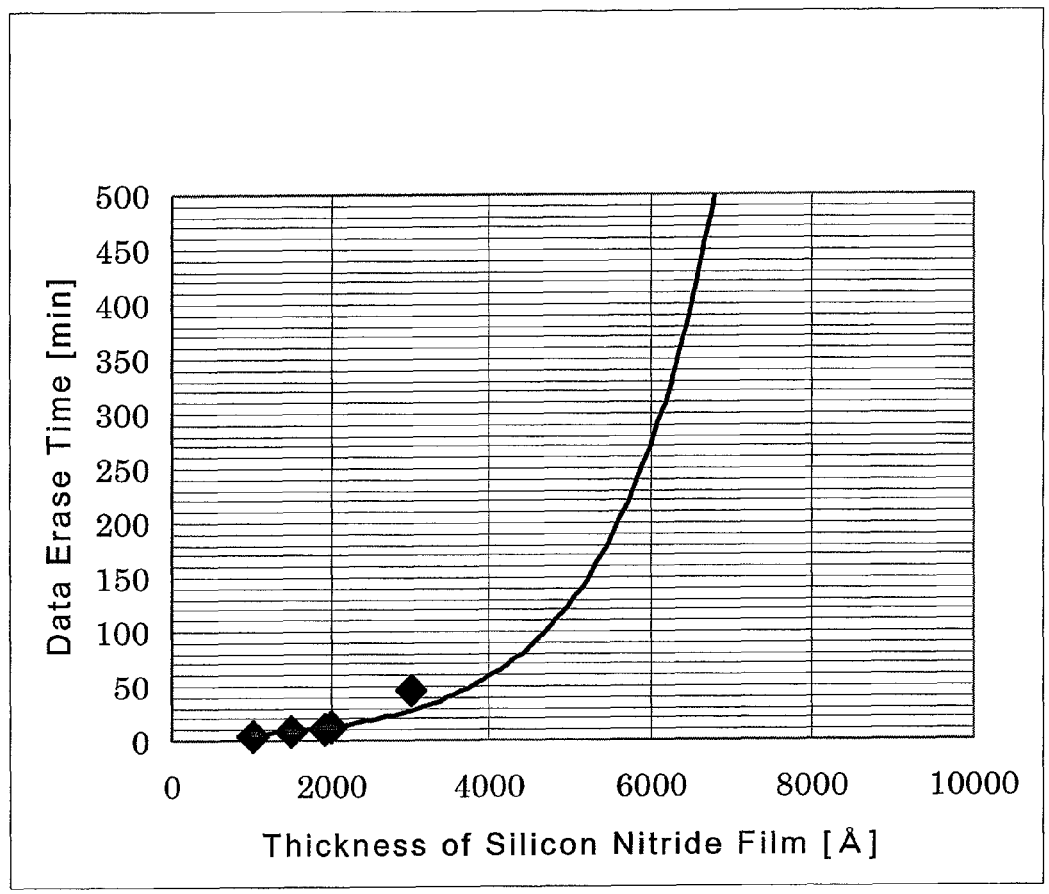
FIG. 3 is a graph for showing a relationship between a thickness of a silicon nitride film and a time for erasing data in an ultraviolet-erasable nonvolatile semiconductor storage element.

An ultraviolet-erasable nonvolatile semiconductor device is now described. FIG. 1 is a sectional view of the ultraviolet-erasable nonvolatile semiconductor device. FIG. 3 is a graph for showing a relationship between a thickness of a silicon nitride film and a time for erasing data in an ultraviolet-erasable nonvolatile semiconductor storage element.

The ultraviolet-erasable nonvolatile semiconductor device includes a semiconductor substrate 10, a nonvolatile semiconductor storage element 17 formed in the semiconductor substrate 10, a top metal 11 formed on the semiconductor substrate 10, and a protective film formed on the top metal 11. Further, the ultraviolet-erasable nonvolatile semiconductor device includes, in part thereof, a pad opening portion 14 obtained by removing the protective film formed on the top metal 11. In this case, the protective film includes two layers of a silicon nitride film 12 and a silicon oxynitride film 13.

Part of the top metal 11 is exposed from the pad opening portion 14, and necessary signal transmission is performed therewith. The silicon nitride film 12 and the silicon oxynitride film 13 cooperate to prevent moisture from penetrating into the ultraviolet-erasable nonvolatile semiconductor device. As a thickness of the silicon nitride film 12 is increased, ultraviolet rays are more difficult to transmit therethrough, and hence such a thickness is selected with which it is possible to shorten the time for erasing data in the nonvolatile semiconductor storage element 17 through irradiation of the ultraviolet rays.

Through a publicly-known semiconductor manufacturing process, the nonvolatile semiconductor storage element 17 such as an erasable programmable read only memory (EPROM) is formed in the semiconductor substrate 10. After that, an inter-layer insulating film (not shown) and the like are laminated on the resultant, and then the top metal 11 is laminated thereon. After that, as the protective film, the silicon nitride film 12 and then the silicon oxynitride film 13 are laminated thereon. After that, the pad opening portion 14 is formed in part of the protective film formed on the top metal 11.

In this case, the silicon nitride film 12 is formed so as to have a thickness of about 1,000 Å or more in order to ensure the water resistance. Moreover, as shown in FIG. 3, when the thickness of the silicon nitride film 12 exceeds about 2,000 Å, the time for erasing data in the ultraviolet-erasable nonvolatile semiconductor storage element is precipitously increased. Thus, it is required that the thickness of the silicon nitride film 12 be set to be about 2,000 Å or less so that the time for erasing data is not unnecessarily increased. With this, the data in the nonvolatile semiconductor storage element 17 can be erased by the ultraviolet rays even in the manufacturing process.

Moreover, the silicon oxynitride film 13 is formed so as to have a refractive index of from 1.65 to 1.85 and a thickness of about 7,000 Å or more, and hence the water resistance can be enhanced. Note that, the silicon oxynitride film 13 does not inhibit the entrance of the ultraviolet rays.

With the configuration described above, the ultraviolet-erasable nonvolatile semiconductor device can have the high water resistance and erase the data by the ultraviolet rays within a period of time that allows the mass production.

Note that, in FIG. 1, the silicon oxynitride film 13 is laminated on the silicon nitride film 12. As illustrated in broken lines, the silicon nitride film 12 may be laminated on the silicon oxynitride film 13.

Figure 2:
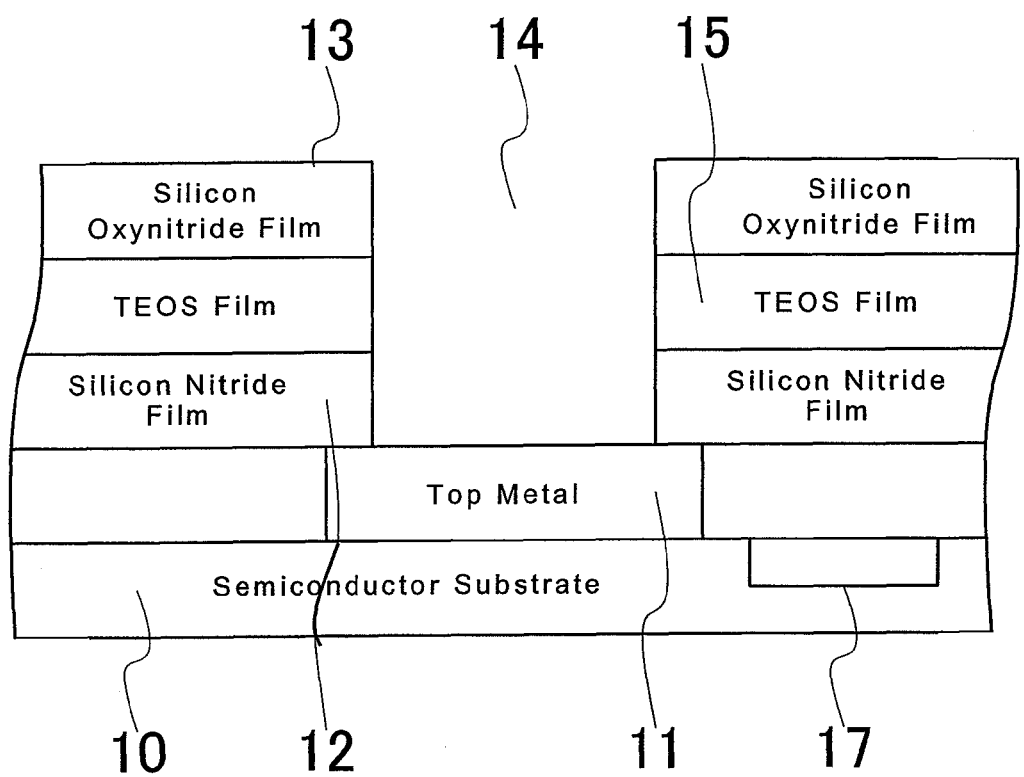
FIG. 2 is a sectional view of an ultraviolet-erasable nonvolatile semiconductor device.

Moreover, as illustrated in FIG. 2, a TEOS film 15 may be added as the protective film between the silicon nitride film and the silicon oxynitride film.

REFERENCE SIGNS LIST 10 semiconductor substrate
11 top metal
12 silicon nitride film
13 silicon oxynitride film
14 pad opening portion
15 TEOS film
17 nonvolatile semiconductor storage element

The invention claimed is:

1. An ultraviolet-erasable nonvolatile semiconductor device, comprising:
   a semiconductor substrate;
   an ultraviolet-erasable nonvolatile semiconductor storage element formed in a surface of the semiconductor substrate;
   a top metal formed on the semiconductor substrate; and
   a protective film formed on the ultraviolet-erasable nonvolatile semiconductor storage element and the top metal, the protective film comprising a first silicon nitride film, a silicon oxynitride film laminated thereon, a thickness of the silicon oxynitride film being thicker than that of the first silicon nitride film, and a second silicon nitride film laminated on the silicon oxynitride film.

2. An ultraviolet-erasable nonvolatile semiconductor device according to claim 1, wherein the first silicon nitride film has a thickness of 1,000 Å or more and 2,000 Å or less.

3. An ultraviolet-erasable nonvolatile semiconductor device according to claim 1, wherein the silicon oxynitride film has a refractive index of from 1.65 to 1.85.

4. An ultraviolet-erasable nonvolatile semiconductor device according to claim 1, wherein the silicon oxynitride film has a thickness of about 7000 Å or more.

5. An ultraviolet-erasable nonvolatile semiconductor device according to claim 4, wherein the first silicon nitride film has a thickness of 1,000 Å or more and 2,000 Å or less.

6. An ultraviolet-erasable nonvolatile semiconductor device according to claim 5, wherein the silicon oxynitride film has a refractive index of from 1.65 to 1.85.

* * * * *